United States Patent
Zhong

(10) Patent No.: US 6,512,468 B1
(45) Date of Patent: Jan. 28, 2003

(54) SYSTEM AND METHOD FOR INCREASING SAMPLE RATE CONVERTER FILTER COEFFICIENT DERIVATION SPEED

(75) Inventor: Eric Zhong, Edison, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/923,229

(22) Filed: Aug. 3, 2001

(51) Int. Cl.$^7$ .............................................. H03M 7/00
(52) U.S. Cl. ........................................ 341/61; 708/313
(58) Field of Search ................ 341/61, 50; 308/322, 308/313

(56) References Cited

U.S. PATENT DOCUMENTS

| | | | |
|---|---|---|---|
| 4,748,578 A | * 5/1988 | Lagadec et al. ............. | 708/313 |
| 5,140,541 A | * 8/1992 | Sakata et al. ............... | 708/322 |
| 5,812,608 A | 9/1998 | Valimaki et al. ............. | 348/538 |
| 5,818,888 A | 10/1998 | Holmqvist ................... | 341/61 |
| 5,907,295 A | 5/1999 | Lin ............................. | 341/50 |
| 5,982,305 A | 11/1999 | Taylor ......................... | 341/50 |
| 6,057,789 A | * 5/2000 | Lin ............................. | 341/61 |
| 6,064,614 A | 5/2000 | Khoury ........................ | 327/52 |
| 6,069,670 A | * 5/2000 | Borer .......................... | 348/620 |

FOREIGN PATENT DOCUMENTS

US 0037351 A1 * 11/2001 ................. 708/313

* cited by examiner

Primary Examiner—Peguy JeanPierre

(57) ABSTRACT

A system for, and method of, increasing sample rate converter filter coefficient derivation and running speed and a digital signal processor incorporating the system or the method. In one embodiment, the system includes: (1) a coefficient table containing a matrix of predefined filter coefficients for each of a plurality of alpha intervals and (2) an intra-range interpolator that adjusts the predefined filter coefficients for a specific alpha within the alpha interval to yield filter coefficients specific to the alpha.

15 Claims, 3 Drawing Sheets

SYSTEM AND METHOD FOR INCREASING SAMPLE RATE CONVERTER FILTER COEFFICIENT DERIVATION SPEED

TECHNICAL FIELD OF THE INVENTION

The present invention is directed, in general, to digital signal processors and, more specifically, to a system and method for increasing sample rate converter filter coefficient derivation and running speed.

BACKGROUND OF THE INVENTION

Digital signal processors (DSPs) currently have a plethora of applications, and the importance of these classes of devices will only continue to grow. For example, DSPs may be used as a digital filter in an environment such as digital audio. In the digital audio environment, the DSP may perform analogous functionality similar to a passive or an active analog filter. However, there are certain problems which may arise in the context of using the DSP as a passive or active filter. For instance, issues pertaining to accommodating differing input and output DSP signal data rates may arise.

One proposed solution associated with accommodating differing input and output DSP signal data rates using such techniques as data interpolation. Interpolations of the input data signal to achieve an acceptable output data signal may involve, however, trade-offs in levels of precision or level of accuracy of the output data. For instance, as a tolerance for approximate solutions pertaining to calculated values of the output signal decreases, the computational, architectural or processing complexity of the DSP may disadvantageously increase, and design trade-offs and decisions should be made. The prior art discloses certain attempts at implementing differing approaches to signal interpolations performed by a DSP.

For instance, in one prior-art approach, a digital signal, which may represent an audio signal that has been sampled at a given rate, is first "up-sampled" or "over-sampled", i.e., between every digital sample at a given frequency there is inserted equidistantly between at least value of zero. Up-sampling effectively increases the sample rate of the input data signal, perhaps for reasons such as helping to avoid aliasing problems and running afoul of the Nyquist sampling theorem.

Next, a Finite Impulse Response ("FIR") filter is used. The FIR filter is programmed with the various tap values desired for a given characteristic, such as the skirt, dB dropoff rate, attenuation rate, passband, and so on. After the FIR filter has been applied, the prior art teaches re-sampling ("decimating") the FIR filtered data, and then linear interpolating the now-decimated data to achieve the desired output sample rate.

The over-sampling FIR plus linear interpolator strategy involves heavy real-time computations of multiplication and addition, and requires large memory space to store the FIR tap coefficients, although the reduction of interpolation factor makes its implementation easier than a single-stage FIR implementation.

A second approach, employing a Continuously Variable Digital Delay ("CVDD") Element, has also been tried. The CVDD has been described in "A Continuously Variable Digital Delay Element" by C. W. Farrow, which is hereby incorporated by reference in its entirety, and shall therefore only be described in a summary fashion.

Briefly, the CVDD Element uses a FIR filter which employs and synchronizes a controllable delay relationship between the input data signal and the output data signal. By changing the delay between the input data signal and the output data signal, the FIR filter of Farrow has the ability to interpolate between samples in the data stream of a band-limited signal.

Advantageously, the CVDD of Farrow does not need large memory space to run since it calculates filter coefficients in real-time with its pre-optimized coefficient taps and a time-varying parameter, a delay "$\alpha$". However, employing the CVDD of Farrow involves vector and matrix operation, which can lead to quite heavy online computation. Another disadvantage of the CVDD of Farrow is the online calculation of $\alpha^n$, which may cause extra difficulties in integerization when the algorithm is implemented on a DSP without a floating-point co-processor.

Accordingly, what is needed in the art is a system and method of filtering and interpating digital data of differing sample rates that overcomes the deficiencies of the prior art.

SUMMARY OF THE INVENTION

To address the above-discussed deficiencies of the prior art, the present invention provides a system for, and method of, increasing sample rate converter filter coefficient derivation and running speed and a digital signal processor incorporating the system or the method. In one embodiment, the system includes: (1) a coefficient table containing a matrix of predefined filter coefficients for each of a plurality of alpha intervals and (2) an intra-range interpolator that adjusts the predefined filter coefficients for a specific alpha within the alpha interval to yield filter coefficients specific to the alpha.

The present invention introduces the broad concept of deriving filter coefficients by first retrieving coefficients valid over a range of alpha intervals from memory and then interpolating the coefficients to yield coefficients specific to a particular alpha.

In one embodiment of the present invention, the intra-range interpolator linearly interpolates the predefined filter coefficients to yield the filter coefficients specific to the alpha. However, those skilled in the art may find nonlinear interpolation useful in a given application.

In one embodiment of the present invention, the sample rate converter comprises a doubler that doubles an input sample rate. Predoubling improves subsequent interpolation, but is not necessary to the present invention.

In one embodiment of the present invention, the sample rate converter comprises a sample interpolator and a sample decimator. The sample interpolator and decimator cooperate to apply the coefficients to a stream of input samples to yield a stream of output samples taken at a desired output rate.

In one embodiment of the present invention, the system the sample interpolator provides samples to the sample decimator. Alternatively, the samples may be decimated before being interpolated, in which case the sample decimator would provide samples to the sample interpolator.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
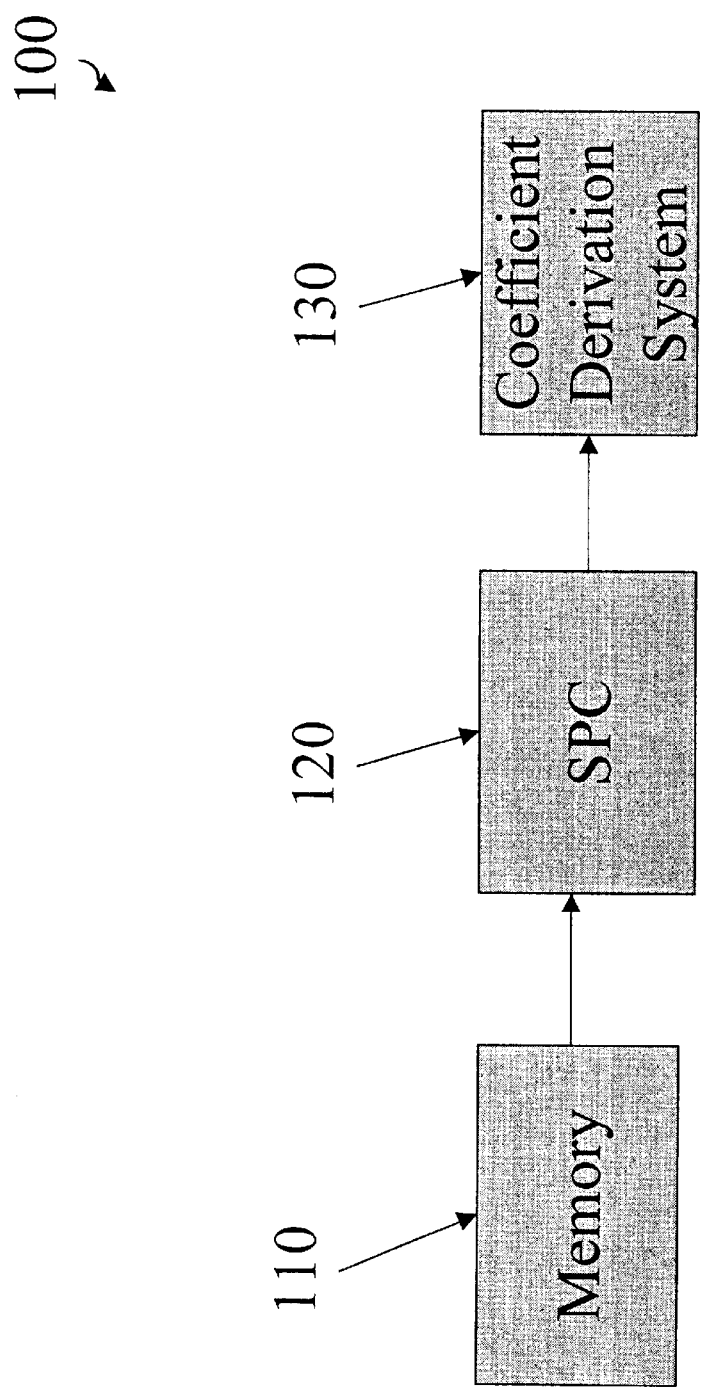
FIG. 1 illustrates an environment of a digital signal processor system ("DSP") data rate converter system ("converter") 100 within which the present invention may operate.

Referring initially to FIG. 1, illustrated is an environment of a digital signal processor system ("DSP") data rate converter system ("converter") 100 within which the present invention may operate. The DSP converter 100 generally converts signal data from an input data rate to a desired output data rate, although the two data rates need not necessarily be disparate. The DSP converter 100 has a memory 110, coupled to a signal processing core ("SPC") 120, coupled to a coefficient derivation system ("CDS") 130. Each of these elements will be described in more detail, below.

The memory 110 generally contains software instructions for the manipulation, storage and retrieval of data, such as matrices, which may be used within the present invention. The memory 110 generally causes the SPC 120 to operate as a sample rate converter which employs filter coefficients to process a stream of input samples. The memory 110 may be of any type that those of ordinary skill in the art would deem appropriate within the environment of the DSP converter 100, and therefore shall not be described in more detail.

The DSP converter 100 has employs the SPC 120. The SPC 100 may be of any type that those of ordinary skill in the art would deem appropriate within the environment of the DSP converter, and therefore shall not be described in more detail.

The DSP converter 100 also employs the CDS 130. A symbol alpha ("α"), in the context of data rate conversion, represents a relative delay between an input data train and output data train. As the starting positions of the two signal trains change relative one to the other over time, α changes in value (i.e. a "specific α value") from −½ to ½ in a cyclical fashion of a discrete interval (i.e. a given cyclical progression of as will have their own "interval α value") over time, assuming that the input rate and output rate are held constant for any given time. In other words, both the specific α values and their associated interval α value is determined as a function of the position of the output data train relative to the input data train. For more information, please refer to Farrow's paper, incorporated herein by reference in its entirety.

Generally, when converting from the input data rate to the output data rate, a different array of tap coefficients must be employed by the FIR filter for each specific α value, in order for the FIR filter to exhibit the desired filter characteristics. In the prior-art data rate converters, as the interval α value could vary unpredictably as the input and output rates would vary, the specific α values could also be any value in a range of −0.5 to 0.5, to an arbitrary number of decimal places. The extreme variability of the specific α value (as the interval α values were not pre-defined) therefore necessitated a real-time calculation of the tap values of the FIR, as the tap values were derived from the specific α values.

However, this prior-art tap-calculation approach leads to quite heavy online computation. Another disadvantage of the prior art is the calculation of $\alpha^n$ (i.e. deriving the specific α value when applying the appropriate interval α value) may cause extra difficulties when the prior-art approaches were implemented on the DSP, such as on a DSP without a floating-point co-processor.

Advantageously, according to the principles of the present invention, for a given range of possible interval α values, a specific predefined interval α value will instead be used by the DSP converter 100, as an approximation to the ultimate real-world α value derived from the input and output data rates. In other words, for any given range of interval α values representing an ultimate real-world input to output signal conversion ratio, the specific α value will be cycled through by the CDS 130 at specific and pre-defined interval α values. One such example is the CDS 130 applying an approximate interval α value of ⅐, which may yield such specific α values as ½, 5/14, 3/14, 1/14, −1/14, and so on.

Having discrete sets of pre-defined interval α values in turn enables the pre-generation of a matrix of specific α values. Thereafter, pre-defined tap-values, derived from specific α values, can be also stored in matrix form in the CDS 130. Deriving FIR tap-values from the a interval is well known in the art, and shall not be described in further detail.

As elaborate upon the above, Finite Impulse Response ("FIR") filter of the CDS 130 which is programmed with certain filter coefficient values, also called "tap" values, which define functioning characteristics of the FIR filter. This FIR filter is generally used to help convert data of one rate to a data of another rate, by specifying such characteristics as passband frequencies, amplitude modulation, skirt (thereby aiding the temporary storage of data signals in buffers as a prerequisite to a data rate conversion), and so on.

As detailed above, these pre-defined tap values are a function of a given, pre-defined α interval value and desired FIR characteristics. Use of pre-defined tap-values enhances the computational efficiency of the DSP 100. For instance, instead of deriving the FIR filter tap-coefficients in real-time, as was taught in the prior art, these values are already stored in the DSP 100.

Arrays of tap-values are employed sequentially by the FIR filter, necessary to achieve a given FIR filter response of the CDS 130. The matrix or matrixes of the CDS 130 therefore contain the tap-values associated with a desired FIR functionality for different specific values of α, as the tap-values of the matrix are a function of a given interval α. More details as to the coefficient tables shall be given below.

The CDS 130 also contains an intra-range interpolator ("IRI"). Generally, the IRI then interpolates, perhaps using Lagrange (linear) interpolation, from an intermediate data output of the FIR to arrive at a specific output data value. As detailed above, the interval α value used to index and access a given tap-value matrix was an approximation. The IRI may then linearly adjust the predefined tap-filter coefficients to yield filter coefficients specific to the ultimate real-world α value.

Alternatively, the IRI may simply interpolate between two output data values as a function of the relative time between the two intermediate samples. As detailed above, as the ultimate real-world interval α value may be different from the approximate α data value, the derived specific α values may be different. The IRI may interpolate the output data value, proportional to its specific α position between two pre-defined specific α values.

For instance, if the precalculated specific α values are −0.1, 0.1, 0.3, and so on (i.e. these values were the values that were used when calculating the tap-value coefficients), but the desired specific α value is that of 0.15, the final data value of the CDS 130 would be ¾ the data value of the specific α value of 0.1 plus ¼ of the data value of the specific α value of 0.3, (i.e, find the average as a function of relative position).

Figure 2:
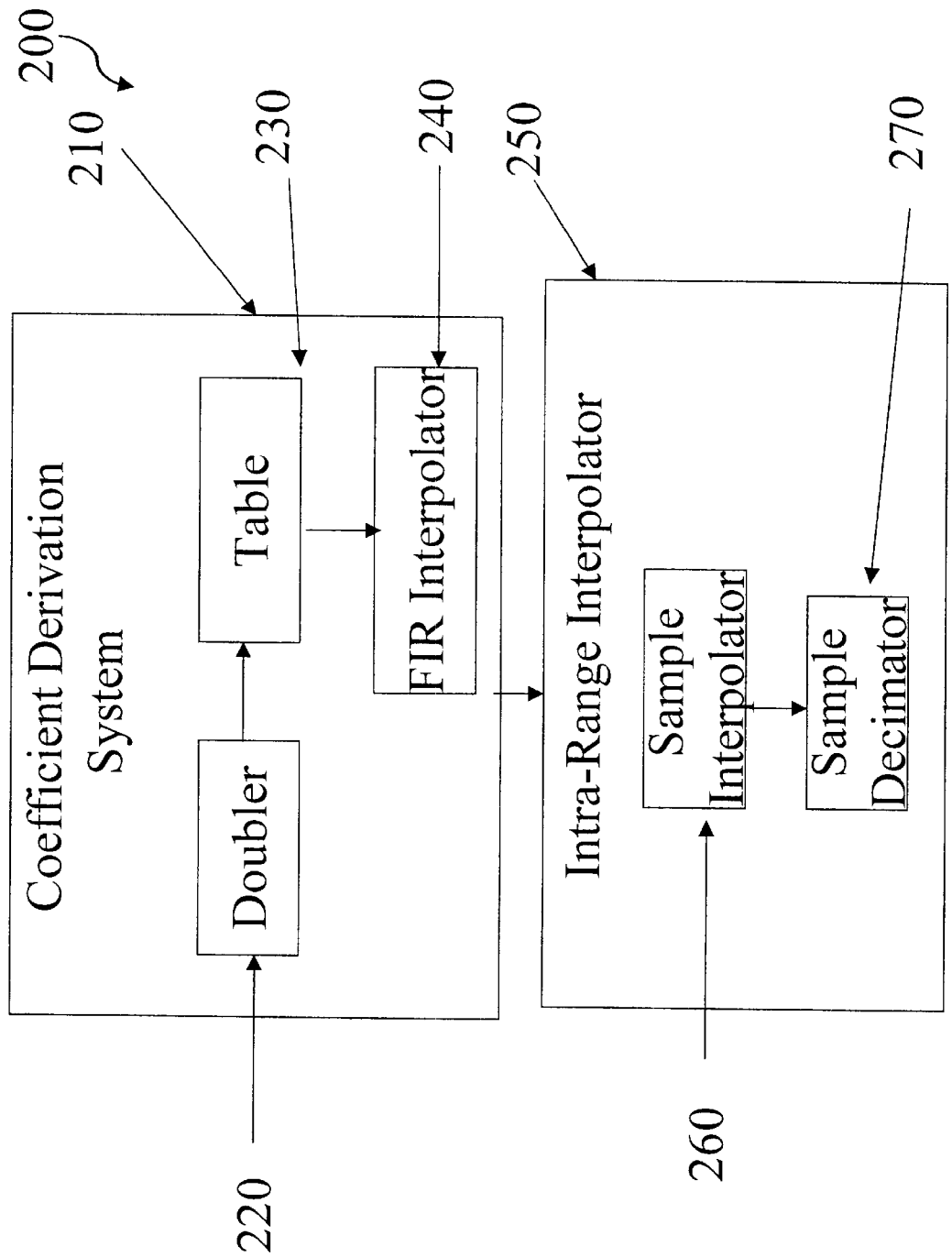
FIG. 2 illustrates an embodiment of a device for increasing a sample rate converter filter's coefficient derivation speed constructed according to the principles of the present invention.

Turning now to FIG. 2, illustrated is an embodiment of a system 200 for increasing sample rate converter filter coefficient derivation speed according to the principles of the present invention. The system 200, associated with the CDS 130, will now be described in more detail.

The system 200 has a CDS 210 coupled to an intra-range interpolator ("IRI") 250. The CDS 210 employs a doubler 220 coupled to a table 230 coupled to a FIR Interpolator 240. The IRI 250 employs a sample interpolator 260 coupled to a sample decimator 270, although those skilled in the art understand that the relative positions of the sample Interpolator 260 and the sample decimater 270 may be reversed.

The doubler 220 is designed to pre-double the sample rate of the digital input signal. One purpose of the doubler 220 is to create a signal band sitting far from the new desired sample rate, so as to reduce the complexity and increase the accuracy of the IRI 250.

The doubler 220 inserts a data value of "zero" between successive samples (i.e. "zero-padding") sampled at a given frequency "f" and then also employs a low pass filter. The low-pass filter may ideally have the following characteristics:

$$H_2(f) = \begin{cases} 2 & \text{for } 0 \le f \le f_{source}/2 \\ 0 & \text{for } f_{source}/2 < f < f_{source} \end{cases}$$

Next the table 230 contains matrixes of tap-value coefficients for use by the FIR filter after the data train has exited the doubler 220. These matrices represent a group of FIR filtertap-value coefficients necessary for the first interpolation of the signal input data.

For instance, if the interval α value=1/64, and use a 12-Tap, $7^{th}$ order FIR filter, the coefficients may be organized into a 2-D matrix in memory, like ($h_i$, for =1 to 1/interval α value). One array of this matrix would look like H (tap coefficients)={h0(0), h0(1), . . . , h0(10),h0(11)}. The use and theory of the use of matrices of tap-values has been described in detail above, and will not be repeated. Next, within the FIR Interpolator 240, arrays of the desired matrix of tap-values are sequentially loaded into the FIR filter. The FIR Interpolator 240 then processes a sampled data value using the FIR filter, which in turns employs the chosen array of tap-values. The FIR interpolator 240 then creates an intermediate data value for use by the IRI 250.

The IRI 250 then employs the sample interpolator 260 and the sample decimator 270 for manipulation of the intermediate data values to get the desired data sample rate. As detailed above, the interval α value used to access a given tap-value matrix was an approximation. In one embodiment of the present invention, the sample iterpolator 260 may then adjust the pre-defined α value to achieve a specific α value, and recalculate the tap-value. The second interpolation is done in this manner because as the data value has already been processed by the FIR interpolator 240 into an intermediate data value, the sample interpolator 260 has less calculations to perform—i.e. it is more efficient to break interpolations into an approximate interpolation by the FIR interpolator 240 and the real-time exact calculation by intra-range interpolator then simply to run one real-time exact calcuation of precise specific α values.

Alternatively, as detailed above, the sample interpolator 260 may interpolate between two intermediate output data values as a function of the relative time between the two samples. As the real-world interval α value may be different from the assumed interval α value employed for ease of pre-calculation of the tap-values, the derived specific α values of the intermediate data value and the desired output data value may be different. The sample interpolator 260 may interpolate the unapproximated data value as a function of the desired data signal rate, proportional to the desired signal's specific α position between two of the closes pre-defined specific α values employed by the FIR interpolator 240.

For instance, if the precalculated specific a values are −0.1, 0.1, 0.3, and so on (i.e. these values were the values that were used when pre-calculating the employed tap-value coefficients), but the calculated specific α value of a data train at the desired output signal rate would be 0.15, a final data value of the IRI 250 for the desired sample would be ¾ the data value of the specific α value of 0.1 plus ¼ of the data value of the specific α value of 0.3, (i.e, find the average as a function of relative position.

Finally, the sample decimator 270 may simply delete certain values that have been calculated. In an alternative embodiment, the sample decimator 270 is employed before the sample interpolator 260, as to advantageously reduce the number of data points used for interpolation by the sample interpolator 260.

Figure 3:
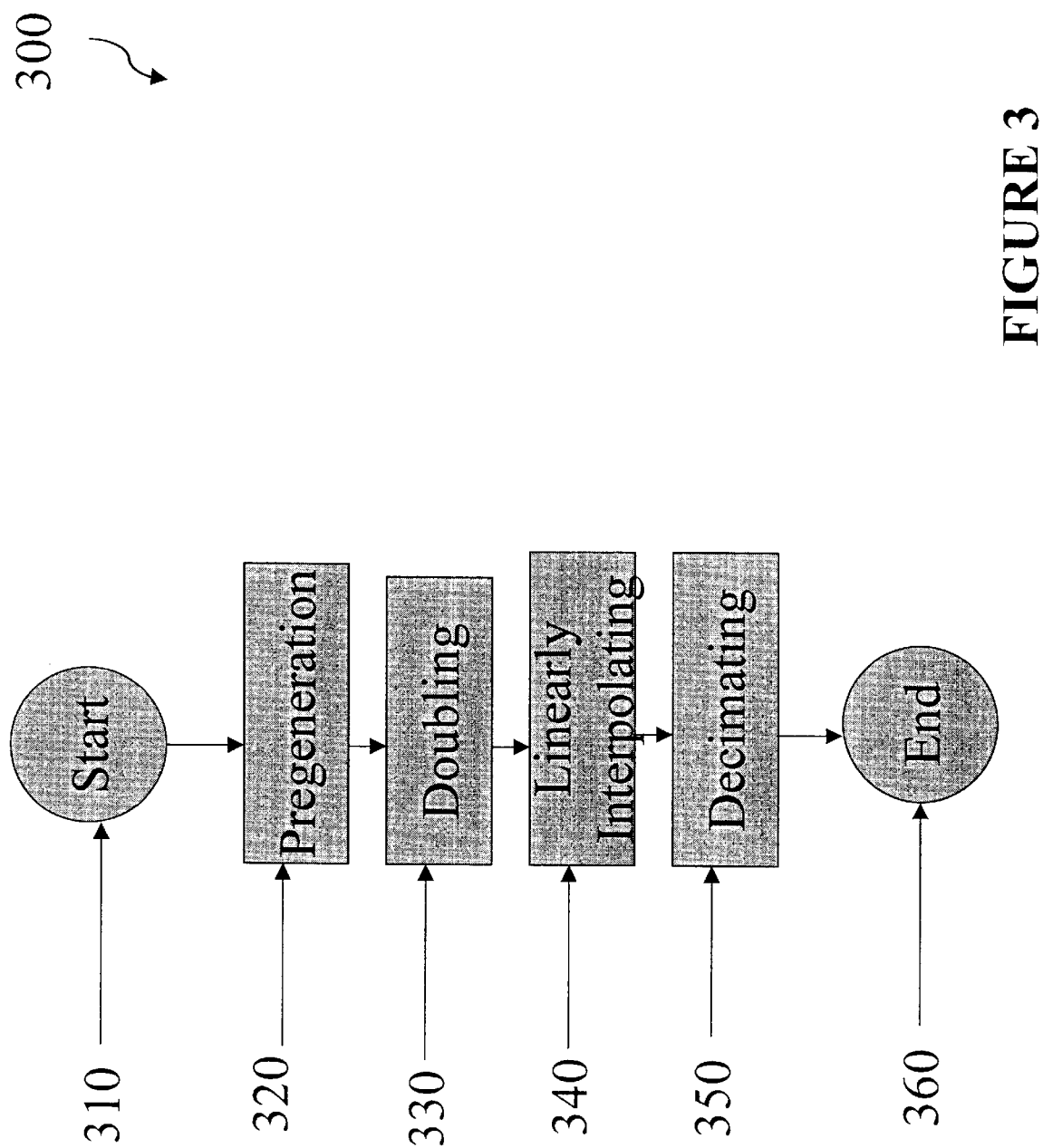
FIG. 3 illustrates a method of use of a digital signal processor according to the principles of the present invention.

Turning now to FIG. 3, illustrated is a method of use of a digital signal processor data rate converter ("converter") 300 built according to the principles of the present invention.

After executing a start 310, the converter 300 pregenerates a coefficient table containing a matrix of predefined filter coefficients for each of a plurality of alpha intervals in a pregeneration step 320. These tables are developed as a function of specific α values, developed as a function of the chosen interval α values, the characteristic response of the FIR filter, the taps of the FIR filter, etc. The rationale behind the pregenerating tables has been detailed above, and will not be discussed again, After pregenerating tables of matrixes in the pregeneration step 320, the converter 300 doubles the effective sample rate of a given input data signal in real-time, through the use of zero-padding in a doubling step 330. The doubled data rate signal is then filtered in the doubling step 330. The rationale behind doubling and filtering of the doubled sample rate data has been detailed up above, and will not be discussed again.

After the doubling has occurred in the doubling step 330, linear interpolation takes place in a linearly interpolating step 340. The linearly interpolating step 340 first calculates an intermediate data value, using the pre-defined tap-values when processed through the FIR filter of the linearly interpolating step 340. The predefined filter coefficients are then linearly interpolated to get the filter coefficients for use by the sample interpolator 260, in the manner described above. Alternatively, the sample interpolator 260 interpolates intermediate data values to get the desired output data rate value.

Next, a decimating step 350 executes. The decimating step 360 generally chooses only to process a certain percentage of input data samples. The rationale behind decimating has been explained above, and shall not be detailed again. Finally, the method of the converter 300 ends with the end step 360.

Although the present invention has been described in detail, those skilled in the art should understand that they can make various changes, substitutions and alterations herein without departing from the spirit and scope of the invention in its broadest form.

What is claimed is:

1. A system for increasing sample rate converter filter coefficient derivation and running speed, comprising:

a coefficient table containing a matrix of predefined filter coefficients for each of a plurality of alpha intervals; and an intra-range interpolator that adjusts said predefined filter coefficients for a specific alpha within said alpha interval to yield filter coefficients specific to said alpha.

2. The system as recited in claim 1 wherein said intra-range interpolator linearly interpolates said predefined filter coefficients to yield said filter coefficients specific to said alpha.

3. The system as recited in claim 1 wherein said sample rate converter comprises a doubler that doubles an input sample rate.

4. The system as recited in claim 1 wherein said sample rate converter comprises a sample interpolator and a sample decimator.

5. The system as recited in claim 4 wherein said sample interpolator provides samples to said sample decimator.

6. A method of increasing sample rate converter filter coefficient derivation and running speed, comprising:

pregenerating a coefficient table containing a matrix of predefined filter coefficients for each of a plurality of alpha intervals; and adjusting said predefined filter coefficients for a specific alpha within said alpha interval to yield filter coefficients specific to said alpha.

7. The method as recited in claim 6 wherein said adjusting comprises linearly interpolating said predefined filter coefficients to yield said filter coefficients specific to said alpha.

8. The method as recited in claim 6 further comprising doubling an input sample rate.

9. The method as recited in claim 6 further comprising:

interpolating samples; and decimating said samples.

10. The method as recited in claim 9 wherein said interpolating precedes said decimating.

11. A digital signal processor, comprising:

a signal processing core;

a memory that contains software instructions, said software instructions causing said signal processing core to operate as a sample rate converter that employs filter coefficients to process a stream of input samples; and a system for increasing sample rate converter filter coefficient derivation and running speed, comprising:

a coefficient table containing a matrix of predefined filter coefficients for each of a plurality of alpha intervals, and an intra-range interpolator that adjusts said predefined filter coefficients for a specific alpha within said alpha interval to yield filter coefficients specific to said alpha.

12. The sample rate converter as recited in claim 11 wherein said intra-range interpolator linearly interpolates said predefined filter coefficients to yield said filter coefficients specific to said alpha.

13. The sample rate converter as recited in claim 11 wherein said sample rate converter comprises a doubler that doubles a sample rate of said stream of said input samples.

14. The sample rate converter as recited in claim 11 wherein said sample rate converter comprises a sample interpolator and a sample decimator.

15. The sample rate converter as recited in claim 14 wherein said sample interpolator provides samples to said sample decimator.

* * * * *